(12) United States Patent
Vann et al.

(10) Patent No.: US 9,077,425 B2
(45) Date of Patent: *Jul. 7, 2015

(54) SYSTEMS AND METHODS FOR ASYNCHRONOUS RE-MODULATION WITH ADAPTIVE I/Q ADJUSTMENT

(71) Applicant: Aviat U.S., Inc., Santa Clara, CA (US)

(72) Inventors: Emerick Vann, Dublin, CA (US);
Yen-Fang Chao, Pleasanton, CA (US);
Youming Qin, Sunnyvale, CA (US);
Roland Matian, San Jose, CA (US)

(73) Assignee: Aviat U.S., Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/155,211

(22) Filed: Jan. 14, 2014

(65) Prior Publication Data

US 2014/0128016 A1 May 8, 2014

Related U.S. Application Data

(63) Continuation of application No. 13/627,996, filed on Sep. 26, 2012, now Pat. No. 8,630,600.

(60) Provisional application No. 61/539,341, filed on Sep. 26, 2011.

(51) Int. Cl.
*H04B 17/00* (2006.01)
*H04B 1/16* (2006.01)
(Continued)

(52) U.S. Cl.
CPC ............... *H04B 1/16* (2013.01); *H03C 3/406* (2013.01); *H03D 3/009* (2013.01); *H03D 7/168* (2013.01); *H04B 1/10* (2013.01); *H04B 1/30* (2013.01); *H04L 27/3854* (2013.01)

(58) Field of Classification Search
CPC ............. H04B 1/16; H03D 7/00; H03D 7/168
USPC .......... 455/39, 91, 102, 130, 135, 131, 190.1, 455/207, 226.3, 323, 17, 20, 21, 22, 118
See application file for complete search history.

(56) References Cited

U.S. PATENT DOCUMENTS 5,479,447 A    12/1995  Chow et al.
5,822,704 A *  10/1998  Ishii ............................ 455/553.1

(Continued)

OTHER PUBLICATIONS

International Application No. PCT/US2012/057379, International Search Report and Written Opinion mailed Jan. 8, 2013.

*Primary Examiner* — Tuan Pham
(74) *Attorney, Agent, or Firm* — Sheppard, Mullin, Richter & Hampton LLP

(57) ABSTRACT

Various embodiments provide for systems and methods for signal conversion of one modulated signal to another modulated signal using demodulation and then re-modulation. According to some embodiments, a signal receiving system may comprise an I/Q demodulator that demodulates a first modulated signal to an in-phase ("I") signal and a quadrature ("Q") signal, an I/Q signal adjustor that adaptively adjusts the Q signal to increase the signal-to-noise ratio (SNR) of a transitory signal that is based on a second modulated signal, and an I/Q modulator that modulates the I signal and the adjusted Q signal to the second modulated signal. To increase the SNR, the Q signal may be adjusted based on a calculated error determined for the transitory signal during demodulation by a demodulator downstream from the I/Q modulator.

14 Claims, 8 Drawing Sheets

(51) Int. Cl.
*H03C 3/40* (2006.01)
*H03D 3/00* (2006.01)
*H03D 7/16* (2006.01)
*H04B 1/30* (2006.01)
*H04L 27/38* (2006.01)
*H04B 1/10* (2006.01)

(56) References Cited

U.S. PATENT DOCUMENTS

| | | | |
|---|---|---|---|
| 5,950,119 A * | 9/1999 | McGeehan et al. | 455/302 |
| 5,982,807 A * | 11/1999 | Snell | 375/146 |
| 8,630,600 B1 * | 1/2014 | Vann et al. | 455/226.3 |
| 2002/0057752 A1 | 5/2002 | Denno | |
| 2002/0132580 A1 | 9/2002 | Buer | |
| 2004/0051598 A1 | 3/2004 | Vann et al. | |
| 2004/0203528 A1 | 10/2004 | Ammar et al. | |
| 2006/0182189 A1 | 8/2006 | Yu et al. | |
| 2007/0086513 A1 | 4/2007 | Fernandez-Corbaton et al. | |
| 2007/0296500 A1 | 12/2007 | Yang | |
| 2008/0025381 A1 | 1/2008 | Lee et al. | |
| 2008/0057899 A1 | 3/2008 | Montemayor et al. | |
| 2008/0146146 A1 * | 6/2008 | Binder et al. | 455/20 |
| 2008/0219379 A1 | 9/2008 | Chrabieh | |
| 2009/0080578 A1 | 3/2009 | Naniwada | |
| 2010/0215125 A1 | 8/2010 | Furman | |
| 2010/0272208 A1 | 10/2010 | Feigin et al. | |
| 2011/0243263 A1 | 10/2011 | Andgart et al. | |
| 2012/0218420 A1 | 8/2012 | Yang et al. | |

* cited by examiner

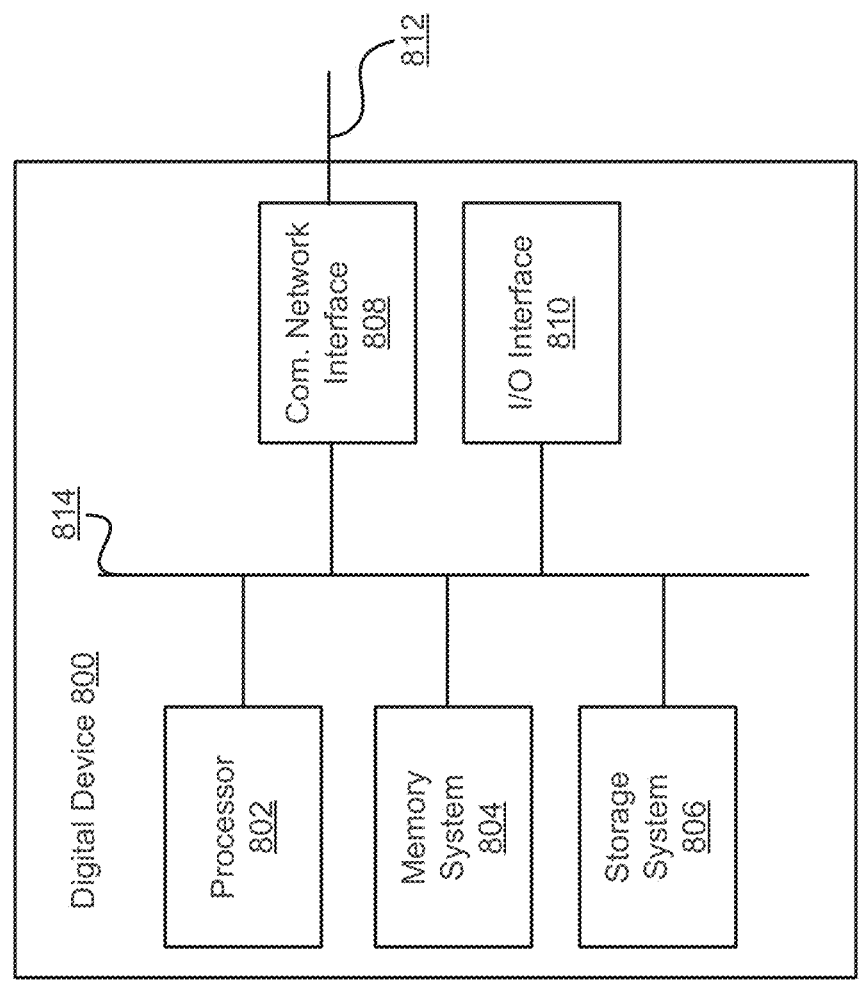

SYSTEMS AND METHODS FOR ASYNCHRONOUS RE-MODULATION WITH ADAPTIVE I/Q ADJUSTMENT

CROSS-REFERENCE TO RELATED APPLICATIONS

The present application is a continuation of U.S. patent application Ser. No. 13/627,996, filed Sep. 26, 2012 and entitled "Systems and Methods for Asynchronous Re-modulation with Adaptive I/Q Adjustment," now U.S. Pat. No. 8,630,600, which claims the benefit of U.S. Provisional Patent Application Ser. No. 61/539,341, filed Sep. 26, 2011 and entitled "Method and Apparatus for Non-Synchronous Remodulator of Zero IF Receiver with Adaptive I/Q Gain Control," each of which is incorporated by reference herein.

FIELD OF THE INVENTION(S)

The present invention(s) relate to receiving signals and, more particularly, to demodulating and modulating signals.

BACKGROUND

Signal modulation plays a key role in many electronic applications, especially those relating to communications where modulation techniques facilitate transmitting and receiving wired and wireless communication signals. Use of modulation techniques is common not only in communications over coaxial cable and twisted pair cables, but also in over-the-air communications at microwave and satellite frequencies. Typically, several stages of signal modulation are involved in transmitting a communications signal from one location and receiving the communications signal at another location. This is often the case for microwave communications, where it can be necessary to transmit a communications signal from a remote site to a local office using a microwave communications system, and then transmit the communications signal from the local office to customer premise equipment (CPE) over a cable.

Traditional signal receivers, particularly those configured to receive wireless signals (e.g., at radio frequencies such as microwave or millimeter wave), employ a heterodyne system to convert a signal from one frequency to another frequency during signal processing. For instance, when a conventional microwave system receives a signal at a microwave frequency, the system translates the signal from the microwave frequency to a lower frequency optimized for transmission over a cable medium. Conventional microwave systems typically perform this translation by converting the radio frequency (RF) signal (in this case at a microwave frequency) to an intermediate frequency (IF) that can be better modulated over cable mediums.

FIG. 1 illustrates one such conventional heterodyne system 100 configured to convert a radio frequency signal 102 to an intermediate frequency signal 120. In particular, the heterodyne system 100 illustrates a double downconversion heterodyne system, where the radio frequency signal 102 is first downconverted to a first intermediate frequency signal 110 for purposes of image filtering, before being downconverted to the second intermediate frequency 120 for subsequent signal processing (e.g., data demodulation and/or carrier recovery). As illustrated, the conventional heterodyne system 100 performs the double downconversion by amplifying the radio frequency signal 102 with an amplifier 104 and then (at a mixer 106) mixing the resulting, amplified radio frequency signal with an oscillator signal (at a frequency $F_1$) generated by a oscillator 108. The mixing results in the first intermediate frequency signal 110 ($IF_1$), which is subsequently filtered by a filter 112 (e.g., for image filtering) and amplified by an amplifier 114 before being mixed (at a mixer 116) with an oscillator signal (at a frequency $F_2$) generated by another oscillator 118. From the mixer 116, the second intermediate frequency signal 120 is produced. Following further amplification, the second intermediate frequency signal 120 would be ready for further demodulation and/or carrier recovery processes.

SUMMARY

Various embodiments provide for systems and methods for signal conversion of one modulated signal to another modulated signal using demodulation and then re-modulation.

According to some embodiments, a signal receiving system is provided comprising an I/Q demodulator, an I/Q signal adjustor, and an I/Q modulator. The I/Q demodulator may be configured to demodulate the first modulated signal to an in-phase ("I") signal and a quadrature ("Q") signal based on a first oscillator signal (e.g., at a first frequency), where the first modulated signal is modulated (e.g., at a remote microwave site) based on a second oscillator signal (e.g., at or near the first frequency) that is asynchronous to the first oscillator signal.

As a result of having the first oscillator signal be asynchronous to the second oscillator signal upon which the first modulated signal is modulated, the I/Q demodulator (also referred to herein as the "receive-side I/Q modulator") is regarded as un-synchronized with the transmit-side I/Q modulator that is providing/generating the first modulated signal. Such a situation may arise in wireless communications environment (e.g., environment using microwave communications), where the I/Q modulator of a wireless transmitter is located at a first site and the I/Q demodulator of a wireless receiver at a second site remote from the first site, where wireless synchronization is difficult or impractical. Generally, when the receive-side I/Q demodulator is not synchronized with the transmit-side I/Q modulator, constellation spin results from the difference between the local oscillator frequency (e.g., of the first oscillator frequency) used by the receiver-side I/Q demodulator and the local oscillator frequency used by the transmit-side I/Q modulator (e.g., 0.01 Hz). This constellation spin can lead to noticeable SNR degradation of modulated signals on the receiver-side. However, various embodiments described herein obviate the need for the receive-side I/Q demodulator to be synchronized with transmit-side I/Q modulator so that the receiver-side, downstream SNR degradation is avoided.

The I/Q signal adjustor may be configured to adaptively adjust the Q signal to increase the signal-to-noise ratio (SNR) of a transitory signal that is based on the second modulated signal, wherein the Q signal is adjusted based on a calculated error determined for the transitory signal. The I/Q modulator may be configured to modulate the second modulated signal based on the I signal and the adjusted Q signal. For some embodiments, the I signal may be filtered (e.g., low-pass filtered) and/or otherwise modified before being modulated. Likewise, for some embodiments, the Q signal may be filtered and/or otherwise modified before or after being adjusted by the I/Q signal adjustor.

Depending on the embodiment, the adaptive adjustment of the Q signal may comprise applying a quadrature correction to the Q signal, adjusting a gain (e.g., differential gain) of the Q signal, or both. By adjusting the Q signal, various embodiments can correct for various types of errors present in the transitory signal that results from the second modulate signal. Examples of errors correctable through the I/Q adjustor may include quadrature error, gain error, delay error, and phase rotation error.

A demodulator downstream (hereafter, referred to as the "downstream demodulator") from the I/Q modulator may subsequently receive the second modulated signal as the transitory signal (e.g., where the transitory signal is identical to or slightly modified in comparison to the second modulated signal) and demodulate the transitory signal for further signal processing (e.g., to retrieve the carried data). For some embodiments, the downstream demodulator may be configured to demodulate the transitory signal and to assist in determining the calculated error for the transitory signal. For example, based on the demodulation of the transitory signal, the downstream demodulator may capable of providing a mean squared error (MSE) for the transitory signal, which may be subsequently utilized in determined a calculated error for the transitory signal (e.g., apply an algorithm to the MSE, such as the steepest decent algorithm). For some embodiments, the signal receiving system may further comprise the downstream demodulator.

For some embodiments, the I/Q signal adjustor may be configured to adaptively adjust the I signal and/or adjust the Q signal to increase the SNR of the transitory signal, where the adjusted I signal and/or the adjusted Q signal is adjusted according to the calculated error determined for the transitory signal. Accordingly, the I/Q modulator may be configured to modulate (i.e., re-modulate) the I and Q signals resulting from the I/Q signal adjustor to the second modulated signal. For instance, the I/Q signal adjustor may adjust just the I signal, just the Q signal, or both, and the I/Q modulator would modulate the second modulated signal based on those signal adjustments. For some embodiments, the I signal and/or the Q signal may be filtered and/or otherwise modified before or after the adjustment process but before the modulation of the second modulated signal based on the I and Q signals resulting from the I/Q signal adjustor.

In various embodiments, the signal receiver system is implemented as a split-mount system, common for microwave systems, where an out-door unit (ODU) comprises the I/Q demodulator, the Q signal adjustor, and the I/Q re-modulator, and where an in-door unit (IDU) is coupled to the ODU and comprises the downstream demodulator. For some embodiments, the downstream demodulator may be part of a remote access card (RAC), which may be configured to be installed/implemented in an ODU.

In some split-mount embodiments, a radio frequency (RF) signal (e.g., microwave frequency signal) may be received at the I/Q demodulator of the ODU as a first modulated signal. From the I/Q signals of the RF signal, the I/Q modulator outputs a second modulated signal having a modulated frequency that is lower than that of the RF signal, and having a modulate frequency that makes the second modulated signal suitable for transmission over a cable (e.g., over a cable coupling the ODU to the IDU). A signal based on the second modulated (a transitory signal) may eventually be received by the downstream demodulator of the IDU, and the downstream demodulator, in turn, will generate the error information (e.g., MSE) for the transitory signal as the transitory signal is demodulated. This error information may eventually be transmitted back to the ODU as telemetry data, which the ODU translates into adjustments to be applied to the I/Q signals of the first modulated signal (e.g., by the I/Q signal adjustor). Subsequently, the adjusted I/Q signals are modulated to a newer second modulated signal that is transmitted to the IDU, thereby repeating the correction process.

By providing the error information from the downstream demodulator of the IDU to the I/Q signal adjustor of the ODU in this manner, various embodiments facilitate an error feedback loop by which the ODU can continuously adjust the second modulated signals in the ODU for the benefit of lessening errors in the transitory signal of the IDU.

According to some embodiments, various operations described herein may be implemented using a digital device and may provide for a computer program product comprising a computer useable medium having computer program code embodied therein for causing a computing device (i.e., a digital device) to perform specific operations described herein. Embodiments described herein may be utilized in converting (e.g., downconvert or upconvert) a signal from one frequency to another frequency.

Other features and aspects of various embodiments will become apparent from the following detailed description, taken in conjunction with the accompanying drawings, which illustrate, by way of example, the features of the various embodiments.

BRIEF DESCRIPTION OF THE DRAWINGS

The drawings are provided for purposes of illustration only and merely depict typical or example embodiments. These drawings are provided to facilitate the reader's understanding and shall not be considered limiting of the breadth, scope, or applicability various embodiments.

FIG. 8 is a block diagram illustrating an example of a digital device that may be utilized by some embodiments.

Figure 1:
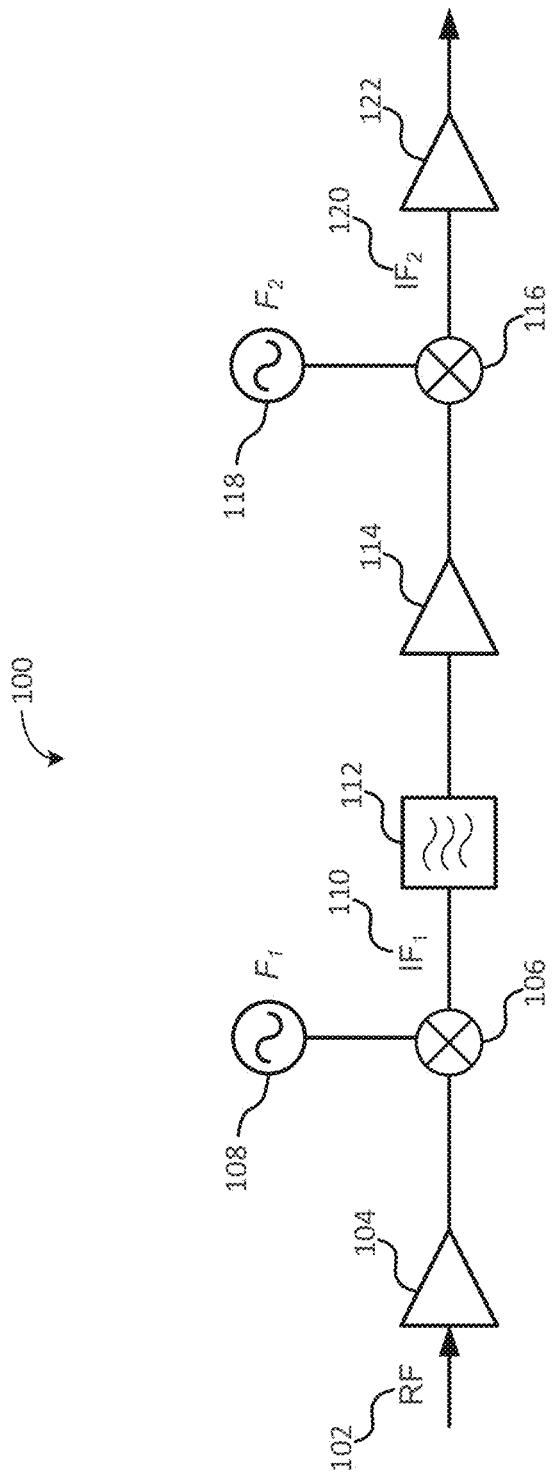
FIG. 1 is a diagram illustrating an example of a conventional heterodyne system used in down conversion of signals.

The figures are not intended to be exhaustive or to limit the embodiments to the precise form disclosed. It should be understood that various embodiments may be practiced with modification and alteration.

DETAILED DESCRIPTION

Various embodiments relate to systems and methods for receiving, demodulating and modulating signals. Some embodiments permit the use of a receiver-side demodulator/modulator combination (also referred to herein as a "re-modulator") that lacks synchronization with a transmitter-side modulator that provides the receiver-side re-modulator with a modulated signal. The re-modulator may adaptively adjust in-phase ("I") and/or quadrature ("Q") signals (e.g., baseband signals) demodulated from the received modulated signal to compensate for the signal-to-noise (SNR) degradation that would otherwise result from the lack of synchronization.

Adjustments to an in-phase signal and/or quadrature signal may comprise adjustment of differential gain or adjustment to phase difference (e.g., by way of a quadrature correction).

Embodiments may adjust the I and/or Q signals to increase the SNR and decrease the mean-squared error (MSE) of a signal that is demodulated downstream from the re-modulator (hereafter, referred to as the "downstream signal"). The MSE for the downstream signal may be provided by a demodulator located downstream from the re-modulator. Additionally, an adaptive algorithm (e.g., steepest decent algorithm) may be applied to the MSE and result in control signals that provide adjustments to the I and/or Q signals by the re-modulator. In particular embodiments, the adaptive algorithm may be used to continuously provide such control signals to the re-modulator, which in turn adjusts the I and/or Q signals for increased SNR. The adaptive algorithm may be applied or the control signal may be provided to the re-modulator when the MSE reaches or surpasses a particular threshold value. Depending on the embodiment, the threshold value may be statically or adaptively determined.

Embodiments may be implemented as a signal receiving system comprising an I/Q demodulator that demodulates a first modulated signal to an in-phase ("I") signal and a quadrature ("Q") signal, an I/Q signal adjustor that adaptively adjusts the Q signal to increase the signal-to-noise ratio (SNR) of a transitory signal ("downstream signal") that is based on a second modulated signal, and an I/Q modulator (hereafter, also referred to as the "receiver-side I/Q modulator") that modulates the I signal and the adjusted Q signal to the second modulated signal. To increase the SNR, the Q signal may be adjusted based on a calculated error of the downstream signal. The error may be determined during processing by a demodulator (e.g., I/Q demodulator) located downstream from the receiver-side I/Q modulator.

Errors observed for the transitory signal may be due, in part, to quadrature imbalance, differential delay in the circuit, gain imbalance between I and Q signals, or quadrature imbalance in the transmitter-side I/Q modulator. These imbalances and/or delays may be attributed to the un-synchronization between the local oscillation utilized by the I/Q demodulator (the receiver-side I/Q modulator) and the local oscillator utilized by the modulator of the transmitter that is generating the first modulated signal (hereafter, referred to as the "transmitter-side I/Q modulator"). Normally, this un-synchronization, may result in undesirable constellation spin (e.g., for QAM signals) at a rate equal to the difference between the local oscillators; even a slight spin (e.g., 0.01 Hz) may be sufficient enough to create imbalances and/or delays that result in SNR degradation downstream from the receiver-side I/Q modulator (i.e., the re-modulator).

However, various embodiments may compensate for the constellation spin stemming from quadrature imbalances, gain imbalances, and/or circuit delays, to achieve increased SNR. In particular, some embodiments may mitigate SNR performance degradation that would otherwise result from the receiver-side I/Q demodulator being not synchronized with the transmitter-side I/Q modulator, especially in applications where the first modulated signal is a high modulation quadrature-amplitude modulation (QAM) signal. Particular embodiments enable demodulation and then modulation (i.e., re-modulation) to be utilized in place of heterodyne downconversion systems, and enable such demodulation/re-modulation to be used without need for synchronization between the local oscillator of the receiver-side demodulator and the local oscillator of the transmitter-side modulator.

In certain embodiments, the use of demodulation/modulation is cheaper than use of a heterodyne downconverter, as demodulation/modulation can be implemented using components (e.g., synthesizers and modulation components) having a lower cost than those of a traditional heterodyne downconversion system. Additionally, the use of demodulation/modulation can offer a less costly approach to intermediate frequency (IF) filtering by enabling replacement of higher cost ceramic filtering down with lower cost filtering of in-phase and quadrature signals (e.g., baseband signals).

The equations that follow are useful in explaining the operation and behavior of some embodiments. The equations are defined according to the following terms.

$\theta$=demodulator quadrature error
$\phi$=demodulator rotation error
$\alpha$=re-modulator quadrature error
g=demodulator to re-modulator baseband gain error
$\Delta\omega$=frequency error between I/Q modulator oscillator and demodulator oscillator.
$\omega_0$=IF frequency of s(t)
$\omega_1$=IF frequency of y(t)
I=Modulator I channel on TX side
Q=Modulator Q channel on TX side Equation 1 may describe a transmitter-side modulator that produces an ideal signal S(t) at IF frequency $\omega_0$.

$$S(t)=I*\text{Cos}(\omega_0 t)+Q*\text{Sin}(\omega_0 t) \quad \text{Equation 1}$$

Equations 2 and 3, as recited below, may describe a receiver-side I/Q demodulator of an embodiment, which is configured to produce a demodulated in-phase signal (Id) and a demodulated quadrature signal (Qd) from the signal S(t) received by the receiver-side I/Q demodulator from the transmitter-side modulator. In accordance with some embodiments, the signal S(t) may be received by the receiver-side I/Q demodulator as a radio frequency (RF) signal (e.g., a QAM signal at a microwave frequency). The signals Id and Qd may not be exact replicas of the signals I and Q received by the transmitter-side modulator (See, Equation 1).

$$Id=S(t)*\text{Cos}(\omega_0 t+\Delta\omega t+\phi+\theta/2), \quad \text{Equation 2}$$

$$Qd=S(t)*\text{Sin}(\omega_0 t+\Delta\omega t+\phi-\theta/2) \quad \text{Equation 3}$$

After multiplying and filtering higher order frequency terms of Equations 2 and 3 (the ones that occur at $2*\omega_0$), the following relationships may result:

$$Id=I*\text{Cos}(\Delta\omega t+\phi+\theta/2)-Q*\text{Sin}(\Delta\omega t+\phi+\theta/2), \quad \text{Equation 4}$$

$$Qd=Q*\text{Cos}(\Delta\omega t+\phi-\theta/2)+I*\text{Sin}(\Delta\omega t+\phi-\theta/2) \quad \text{Equation 5}$$

For Equations 4 and 5, the term $\Delta\omega$ may describe the constellation spin that results from the receiver-side I/Q demodulator being not synchronized with the transmitter-side modulator. As noted herein, such spin can be a source of error and SNR degradation in demodulators downstream from the receiver-side I/Q modulator of some embodiments (described below by Equations 6 and 7). Generally, when there is no constellation spinning, the constellation may be considered stable but may still be rotated by $\phi$. When the constellation is spinning but there are no quadrature and gain errors, then demodulation downstream from the receiver-side I/Q modulator may not be affected by the spinning. However, when there is constellation spinning as well as quadrature and/or gain errors, SNR degradation result in downstream demodulators.

Equation 6, as recited below, may describe the receiver-side I/Q modulator of an embodiment, which generates a new signal, the signal Y(t) at a different intermediate frequency.

$$Y(t)=g*Id*\text{Cos}(\omega_1 t+\alpha/2)+Qd*\text{Sin}(\omega_1 t-\alpha/2) \quad \text{Equation 6}$$

Multiplying out the signal Y(t) in Equation 6 may result in Equation 7.

$$Y(t) = I\{g[\cos(\omega_1 t - \Delta\omega t - \phi + \alpha/2 - \theta/2) + \cos(\omega_1 t + \Delta\omega t + \phi + \alpha/2 + \theta/2)] + \cos(\omega_1 t - \Delta\omega t - \phi - \alpha/2 + \theta/2) - \cos(\omega_1 t + \Delta\omega t + \phi - \alpha/2 - \theta/2)\} + Q\{g[\sin(\omega_1 t - \Delta\omega t - \phi + \alpha/2 - \theta/2) - \sin(\omega_1 t + \Delta\omega t + \phi + \alpha/2 + \theta/2)] + \sin(\omega_1 t - \Delta\omega t - \phi - \alpha/2 + \theta/2) - \sin(\omega_1 t + \Delta\omega t + \phi - \alpha/2 - \theta/2)\}$$  Equation 7

Equations 8 and 9, as recited below, may describe the downstream demodulator and carrier recovery, which produces the signals Ir and Qr from the signal Y(t) produced by the receiver-side I/Q modulator (See, Equations 6 and 7). As shown by Equations 8 and 9, demodulation of the signal Y(t) to the signals Ir and Qr may accomplished by multiplying Y(t) by $\cos(\omega_1 t - \Delta\omega t - \phi)$ and $\sin(\omega_1 t - \Delta\omega t - \phi)$ respectively. By demodulating in accordance with Equations 8 and 9, various embodiments can determine errors within the signal Y(t) (e.g., quadrature and/or phase rotation errors) that result in SNR degradation.

$$Ir = I\{\cos(\alpha/2 - \theta/2)*(1+g) + g*\cos(2*\Delta\omega t + 2*\phi + \alpha/2 + \theta/2) - \cos(2*\Delta\omega t + 2*\phi - \alpha/2 - \theta/2)\} + Q\{\sin(\alpha/2 - \theta/2)*(g-1) - g*\sin(2*\Delta\omega t + 2*\phi + \alpha/2 + \theta/2) + \sin(2*\Delta\omega t + 2*\phi - \alpha/2 - \theta/2),$$  Equation 8

$$Qr = Q\{\cos(\alpha/2 - \theta/2)*(1+g) - g*\cos(2*\Delta\omega t + 2*\phi + \alpha/2 + \theta/2) + \cos(2*\Delta\omega t + 2*\phi - \alpha/2 - \theta/2)\} + I\{\sin(\alpha/2 - \theta/2)*(1-g) - g*\sin(2*\Delta\omega t + 2*\phi + \alpha/2 + \theta/2) + \sin(2*\Delta\omega t + 2*\phi - \alpha/2 - \theta/2)\}$$  Equation 9

As described herein, based on the determined errors, certain embodiments adjust the signal Id or the signal Qd in Equation 7 to mitigate those determined errors. For instance, systems and methods described herein may apply a quadrature correction (e.g., resulting in an adjustment to α) and/or a gain adjustment to the signal Id signal or the signal Qd (e.g., resulting an adjustment to g of 0.9 or 1.1).

Figure 2:
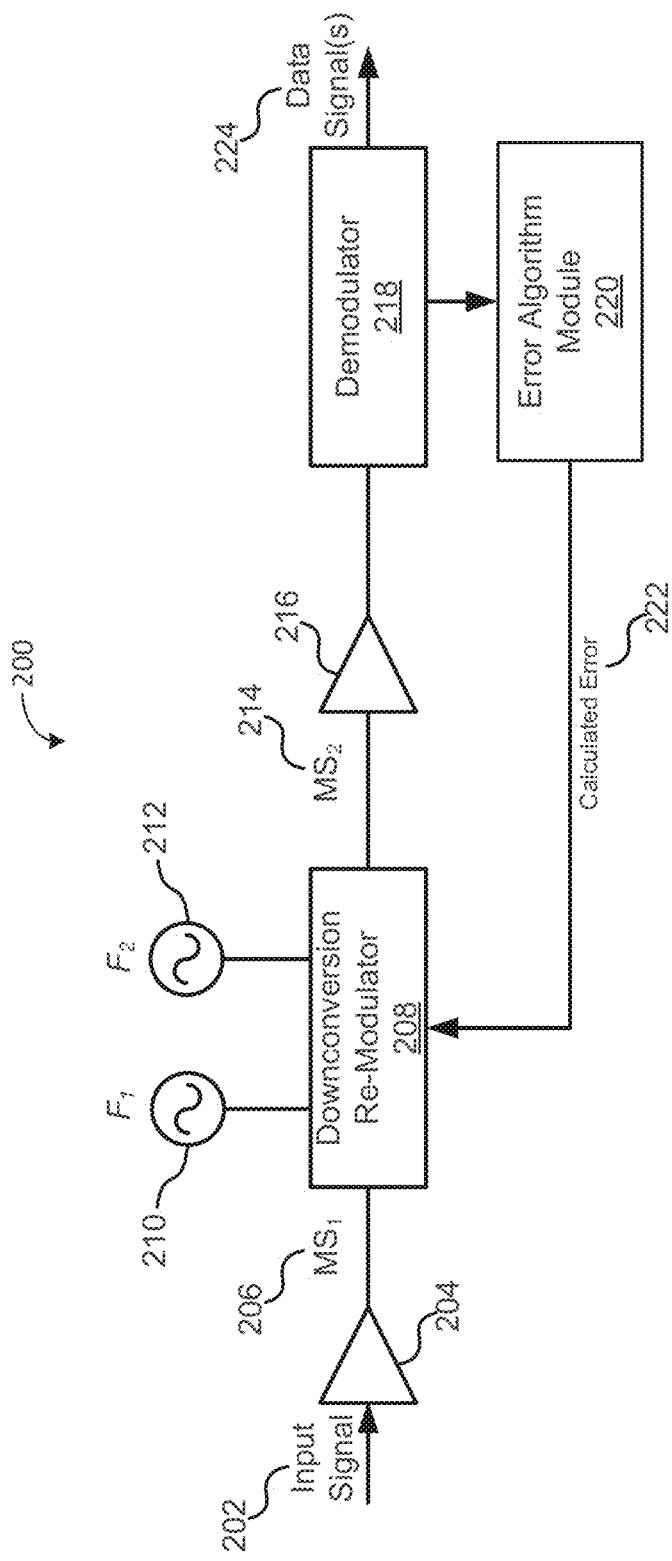
FIG. 2 is a diagram illustrating an example of a signal receiving system in accordance with some embodiments.

FIG. 2 is a diagram illustrating an example of a signal receiving system 200 in accordance with some embodiments. In addition to applications relating to wired and wireless communication systems, the illustrated system 200 may be implemented for electronic applications where signal processing is utilized, such as video processing or audio processing. As shown, the signal receiving system 200 comprises amplifiers 204 and 216, a downconversion re-modulator 208 coupled to local oscillators 210 and 212, a demodulator 218 downstream from the downconversion re-modulator 208, and an error module 220 coupled to the demodulator 218. The system 200 may begin at the amplifier 204, where an input signal 202 is received for downconversion. In the contexts of wireless communications, the input signal 200 may be a radio frequency (RF) signal (e.g., at microwave frequency) received by via an RF antenna coupled to the amplifier 204. The amplifier 204 may amplify the input signal 200 and provide the resulting signal as a first modulated signal 206

The downconversion re-modulator 208 may be configured to downconvert the first modulate signal 206 (e.g., the input signal 202 as provided by the amplifier 204) to a second modulated signal 214, without requiring synchronization with the transmitter that provided the first modulated signal.

By way of example, the downconversion re-modulator 208 may receive the first modulated signal from the amplifier 204 and demodulate the first modulated signal 206 to an in-phase ("I") signal and a quadrature ("Q") signal based on a first oscillator signal at frequency $F_1$ from the local oscillator 208. As discussed below, The first oscillator signal may be un-synchronized with the oscillator signal used in the modulation of the first modulated signal. Subsequently, the downconversion re-modulator 208 may be adaptively adjust the Q signal to increase the signal-to-noise ratio (SNR) for a transitory signal that is based on the second modulated signal 214 outputted by the downconversion re-modulator 208.

For some embodiments, the downconversion re-modulator 208 may adjust the Q signal based on a calculated error 222 provided in response to demodulation of the transitory signal by a demodulator downstream from the downconversion re-modulator 208. In one example, the demodulator 218 may receive (as the transitory signal) an amplified signal from the amplifier 216 based on the second modulated signal 214, and demodulates to data signal(s) 224 (e.g., I and Q signals). As a result of the demodulation, the demodulator 218 may provide error data regarding the transitory signal to the error module 220. The error module 220, in turn, may apply an adaptive function (e.g., steepest decent algorithm) to the provided error data and generate the calculated error 222 in response. In doing so, the demodulator 218 and the error module 220 enable the downconversion with re-modulator 208 to adjust the I signal and/or the Q signal downstream error feedback.

In performing various operations, the downconversion re-modulator 208 may comprise an I/Q modulator, an I/Q demodulator, and components operable in adjusting an I signal, a Q signal, or both. Components that facilitate adjustment of the I signal and/or the Q signal may include filters (e.g., low pass filters), multiplier(s), variable gain amplifier, cross taps, and the like. More with respect to these circuits and components are further described below with regard to FIG. 4.

Those skilled in the art will appreciate that for certain embodiments, the downconversion re-modulator 208 may be replaced by an alternative re-modulator that performs upconversion or performs some combination of both upconversion and downconversion. Additionally, in accordance with some embodiments, the use of two local oscillators (210, 212), as illustrated in FIG. 2, may enable the downconversion re-modulator 208 to replace one or two downconverters of a traditional double downconversion heterodyne system (e.g., downconversion to frequency $F_1$ and downconversion to frequency $F_2$).

Though the FIG. 2 illustrates the downconversion re-modulator 208 being coupled to two local oscillators, those skilled in the art will appreciate that various embodiments may have more or less oscillators coupled to the re-modulator. For example, the downconversion re-modulator 208 may be coupled to a single local oscillator.

Figure 3:
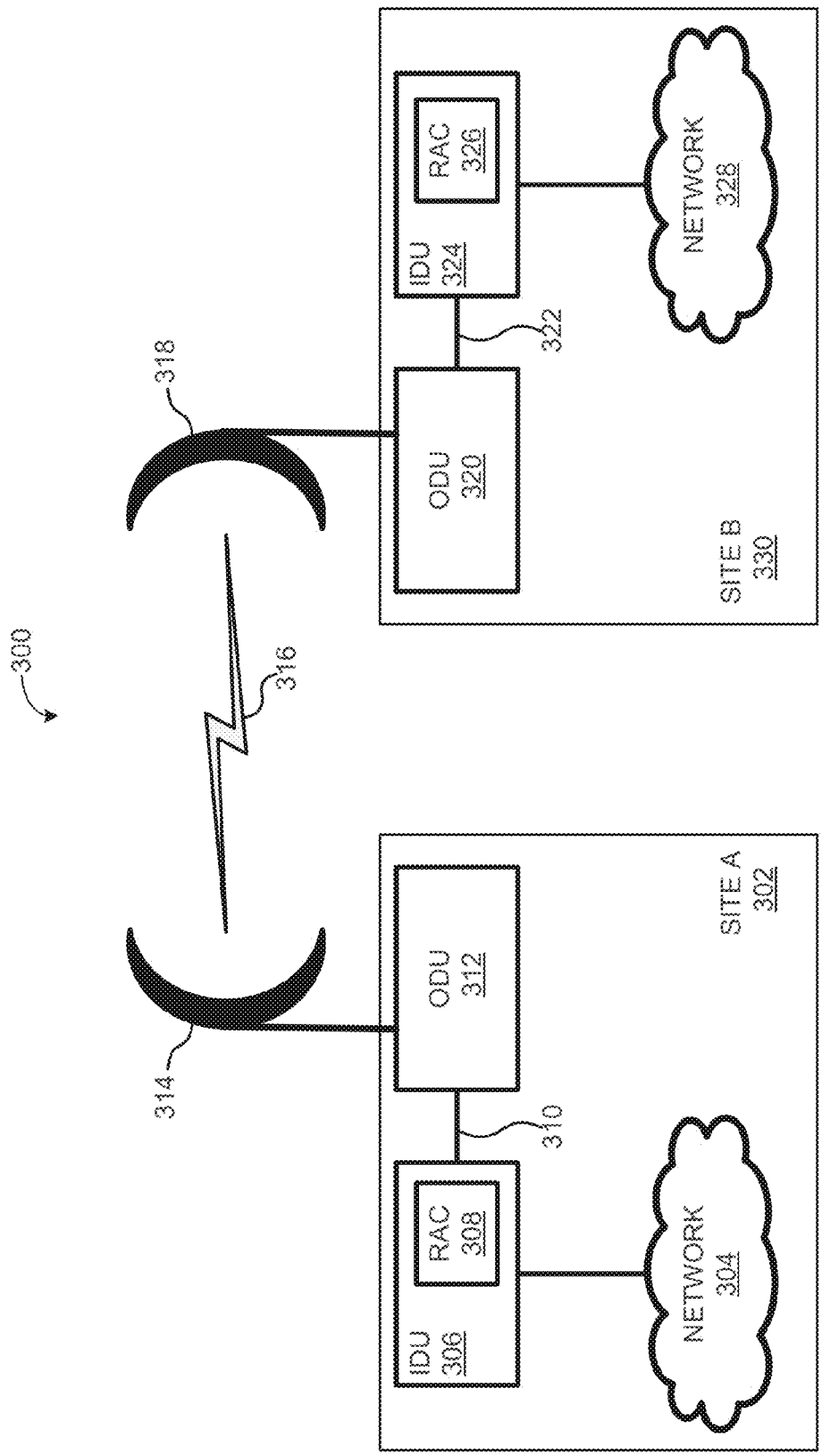
FIG. 3 is a diagram illustrating an example of a microwave communications system in which various embodiments may be implemented or utilized.

FIG. 3 is a diagram illustrating an example of a microwave communications system 300 in which various embodiments may be implemented or utilized. As shown, the exemplary microwave communications system 300 is a split-mount wireless system comprising indoor units (IDU) 306 and 324, outdoor units (ODU) 312 and 320, and antennas 314 and 318 at each of two communications sites 302 and 330. Each of the IDUs 305 and 324 may comprise a radio access card (RAC) 308, 326 respectively configured to communicatively couple the IDUs to the respective ODU 312, 320 (e.g., via cables 310 and 322). In FIG. 3, the microwave communications system 300 facilitates communications between a network 304 and a network 328.

The IDUs 306 and 324 may function as the signal processing units for the microwave communications system 300. Generally, locating the signal processing equipment in the IDU helps minimize the amount of equipment that has to be located in the ODUs 312 and 320. For some embodiments, each of the IDUs 306 and 324 comprises a digital signal processor module, a combiner/splitter module, a modem module, a power supply modules, and possibly auxiliary components/modules (e.g., for redundancy). The ODUs 312 and 320 and/or IDUs 306 and 324 may utilize waveguides and/or waveguide filters to implement their particular functionalities.

As illustrated, the IDUs 306 and 324 are coupled to the ODUs 312 and 320. The ODUs may function as the radio frequency units for the microwave communications system 300 and, as such, may comprise the intermediate frequency (IF) and radio frequency (RF) equipment needed to transmit and receive wireless signals over a wireless channel. For example, each of the ODUs 312 and 320 may comprise two or more transceivers modules, and a transducer module that connects to the antenna (314 and 318). Generally, the ODUs 312 and 320 are responsible for converting the data stream (e.g., binary data or analog signal) from the IDUs 306 and 324 into corresponding wireless signal(s) to be transmitted via the antennas 314 and 318, and converting wireless signal(s) received via the antennas 314 and 318 into a corresponding data stream (e.g., binary data or analog signal) to be processed by the IDUs 306 and 324. As noted herein, the antennas 314 and 318 may be configured to transmit and receive wireless signals.

While the embodiments described in FIG. 3 are described in the context of a microwave transmission system, some embodiments may be implemented in other wireless communications system, including indoor-only systems, and cellular phone systems, WiFi systems, and the like.

Figure 4:
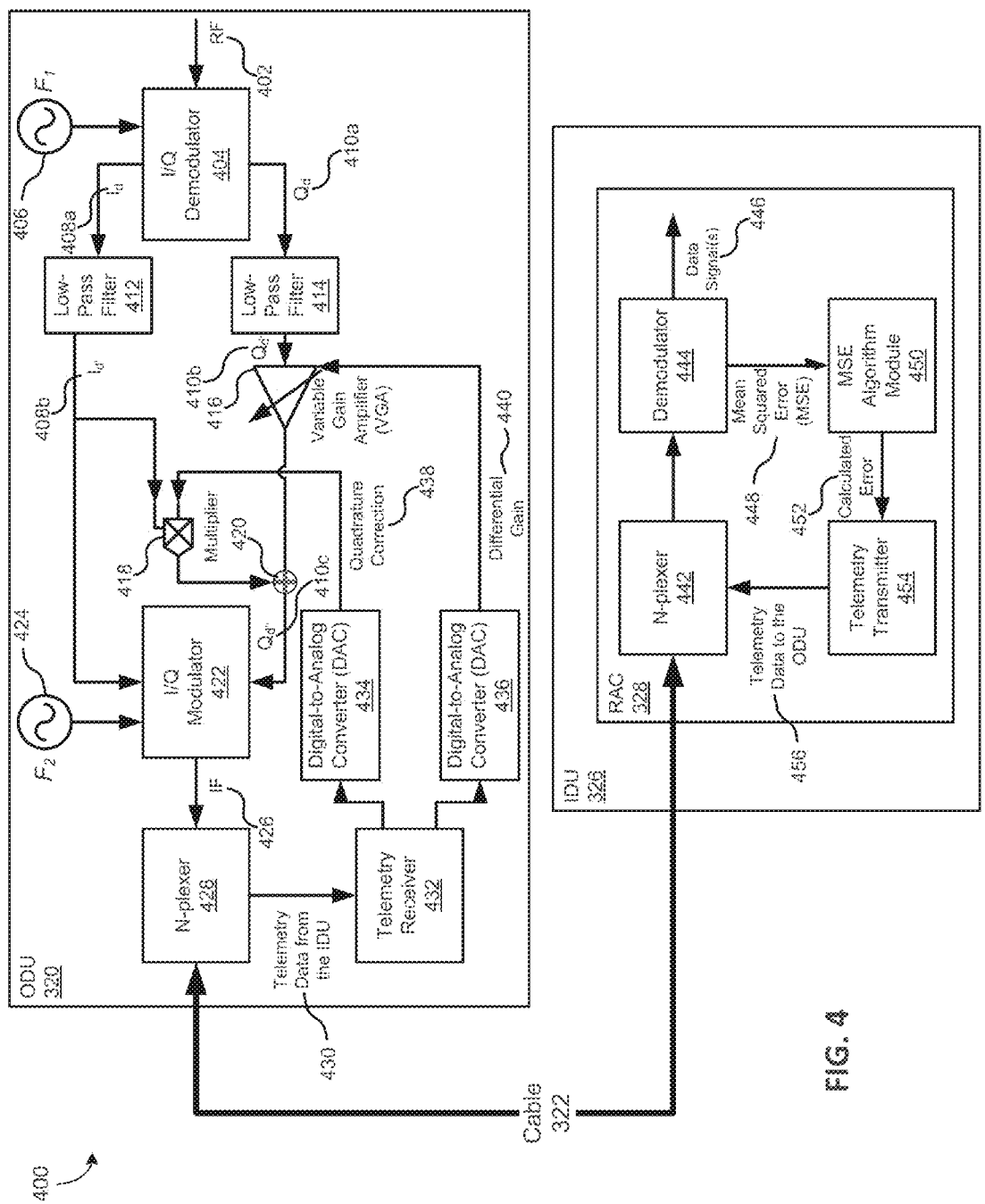
FIG. 4 is a diagram illustrating an example of a split-mount system in accordance with some embodiments.

FIG. 4 is a diagram illustrating an example of a split-mount system 400 in accordance with some embodiments. As shown, the split-mount system 400 may comprise the outdoor-unit (ODU) 320 and the in-door unit (IDU) 324 coupled to the ODU 320 via the cable 322. In accordance with FIG. 3, the ODU 320 may be coupled to the antenna 318, which receives a radio frequency (RF) signal (e.g., communication 316) from a system at site A 302 and delivers the RF signal to the ODU 320. On the other end, the IDU 324 may be coupled to the communications network 328, and is generally configured to provide data from the RF signal to the network 328.

As illustrated in FIG. 4, the ODU 320 may comprise an I/Q demodulator 404, local oscillators 406 and 424, low-pass filters 412 and 414, a variable gain amplifier (VGA) 416, a multiplier 418, a cross-tap 420, an I/Q modulator 422, a N-plexer 428, a telemetry receiver 432, and digital-to-analog converters (DACs) 434 and 436. The IDU 324 may comprise an N-plexer 442, a demodulator 444, a MSE module 450, and a telemetry transmitter 454, some or all of which may be part of the remote access card (RAC) disposed in the IDU 324. In the ODU 320, the I/Q demodulator 404, the low-pass filters 412 and 414, the variable gain amplifier (VGA) 416, the multiplier 418, the cross-tap 420, and the I/Q modulator 422 may constitute the re-modulator for certain embodiments, which may not be synchronized with the transmitter that provides the RF signal 402. In the IDU 324, the demodulator 444 may constitute the downstream demodulator that provided error feedback to the re-modulator for I/Q signal adjustment purposes.

In accordance with some embodiments, a radio frequency (RF) signal 402, received via an antenna coupled to the ODU 320, may be provided to the I/Q demodulator 404 for demodulation into an in-phase signal (Id) 408a and a quadrature signal (Qd) 410a at a local oscillation frequency $F_1$ (generated by the local oscillator 406). Depending on the embodiment, the in-phase signal (Id) 408a and the quadrature signal (Qd) 410a may be considered baseband signals of the RF signal 402. Following demodulation, the in-phase signal (Id) 408a and the quadrature signal (Qd) 410a may be filtered for undesired signals before further processing, thereby resulting in a filtered in-phase signal (Id') 408b and a filtered quadrature signal (Qd') 410b.

To increase downstream SNR in the IDU 324, the filtered quadrature signal (Qd') 410b may be adjusted by way of the variable gain amplifier (VGA) 416 and/or the multiplier 418 and the cross-tap 420 disposed between the I/Q demodulator 404 and the I/Q modulator 422. While the VGA 416 may control the differential gain between the filtered in-phase signal (Id') 408b and the filtered quadrature signal (Qd') 410b, the multiplier 418 and the cross-tap 420 may control the quadrature error by multiplying the filtered in-phase signal (Id') 408b to the filtered quadrature signal (Qd') 410b. Since the multiplying coefficient may be a positive (+) or negative (−) voltage, the multiplier 418 may be a 4-quadrant multiplier.

Though FIG. 4 depicts both the differential gain and the quadrature error of the system 400 being controlled through adjustment of the filtered quadrature signal (Qd') 410b to adjusted quadrature signal (Qd") 410c, those skilled in the art will appreciate that some embodiments may adjust the filtered in-phase signal (Id') 408b in addition to or in place of adjusting the filtered quadrature signal (Qd') 410b. Additionally, those skilled in the art will also appreciate that embodiments may employ different methods of I/Q signal adjustment when controlling errors that result from the in-phase signal (Id) 408a and/or the quadrature signal (Qd) 410a. Furthermore, notwithstanding adjustments to the filtered in-phase signal (Id') 408b and/or the filtered quadrature signal (Qd') 410b for purposes of increasing downstream SNR, various embodiments may filter and/or otherwise modify the in-phase signal (Id) 408a and/or the quadrature signal (Qd) 410a in a different manner and different order (e.g., filter after adjustment) than what is illustrated for the system 400.

Thereafter, the I/Q modulator 422 may modulate, as the second modulated signal, an intermediate frequency (IF) signal 426 based on the filtered in-phase signal (Id') 408b, the adjusted quadrature signal (Qd") 410c, and a oscillator signal generated by the local oscillator 424 at a frequency $F_2$. For some embodiments, the frequency $F_2$ may be such that the IF signal 426 is suitable for transmission over the cable 322 (e.g., 600 MHz), so as to reduce cable loss. Eventually, the resulting IF signal 426 may be routed from the ODU 320 to the IDU 324, through the N-plexer 428, and over the cable 322.

Eventually, the demodulator 444 may receive the intermediate frequency (IF) signal 426, as a downstream modulated signal, through the N-plexer 442 and over the cable 422. The demodulator 444, in turn, demodulates the IF signal 426 into data signal(s) 446. For example, the data signal(s) 446 may comprise I and Q signals which a modem or other device (e.g., disposed in the IDU 324) can translate into data signals for a network connection (e.g., to the network 328). According to some embodiments, the demodulator 444 may be configured to provide error information, such as mean-squared error (MSE) 448, from the demodulation process, where the error information relates to the IF signal 426. As illustrated, the MSE module 450 may apply an algorithm to the MSE 448 received from the demodulator 444 and output a calculated error 452 that can be utilized by the ODU 320 in its adjustment of the filtered quadrature signal (Qd') 410b.

According to some embodiments, the calculated error 452 may be transmitted from the IDU 324 to the ODU 320 as telemetry data 456, via the telemetry transmitter 454, the N-plexer 442, and then over the cable 422. The telemetry data transmitted from the IDU 324 to the ODU 320 could include information other than the calculated error 452 including, for example, settings for the ODU 320 and information regarding the current status of the IDU 320. The telemetry data 456 may be transmitted from the IDU 324 to the ODU 320 over the cable 322 using frequency-shift keying (FSK) modulation. For some embodiments, the telemetry data 456 may be transmitted from the IDU 324 to the ODU 320 over the cable 322 at a signal frequency between approximately 4 MHz and 5 MHz.

The ODU 320 may receive the telemetry data 456 from the IDU 324, at the telemetry receiver 432, as the telemetry data 430. From the received telemetry data 430, the telemetry receiver 432 may be configured to extract one analog signal that can be converted to a quadrature correction digital control signal 438, and another analog signal that can be converted to a differential gain digital control signal 440. In accordance with various embodiments, the digital-to-analog converters (DACs) 434 and 436 may facilitate conversion of the analog signals extracted from the telemetry data 430 to the digital control signal 438 for quadrature correction 438, and the digital control signal 440 for differential gain. The multiplier 418 may apply adjustments to the filtered quadrature signal (Qd') 410b according to the quadrature correction digital control signal. Similarly, the variable gain amplifier (VGA) 416 may apply a differential gain to the filtered quadrature signal (Qd') 410b according to the differential gain digital control signal 440.

Figure 5:
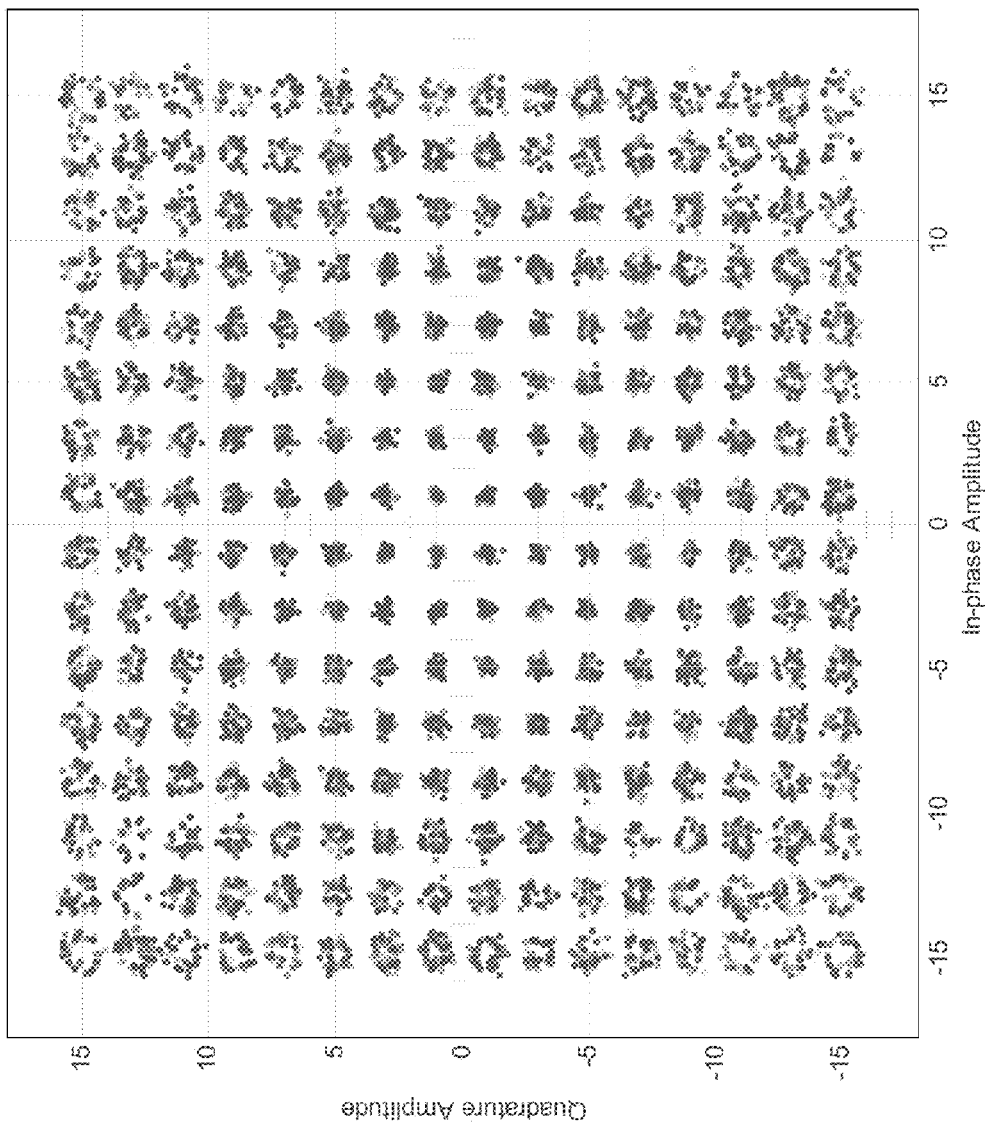
FIG. 5 is an example of a constellation plot illustrating signal error.

FIG. 5 is an example of a constellation plot 500 illustrating signal error. In particular, the constellation plot 500 illustrates the demodulation results of a signal before the I and Q signals are adjusted (e.g., gain adjustment and/or quadrature correction) in accordance with some embodiments. The results of the constellation plot 500 are based on one or more quadrature, phase, gain, and carrier rotation errors existing in the pre-adjusted I and Q signals. The constellation plot 500 exhibits a SNR of 29.6 dB due to the I/Q signal impairments. The spinning results in the outer points of the constellation forming circles generally reduce the SNR performance downstream from a re-modulator that is not synchronized with a transmitter that is providing it with a modulated signal.

Figure 6:
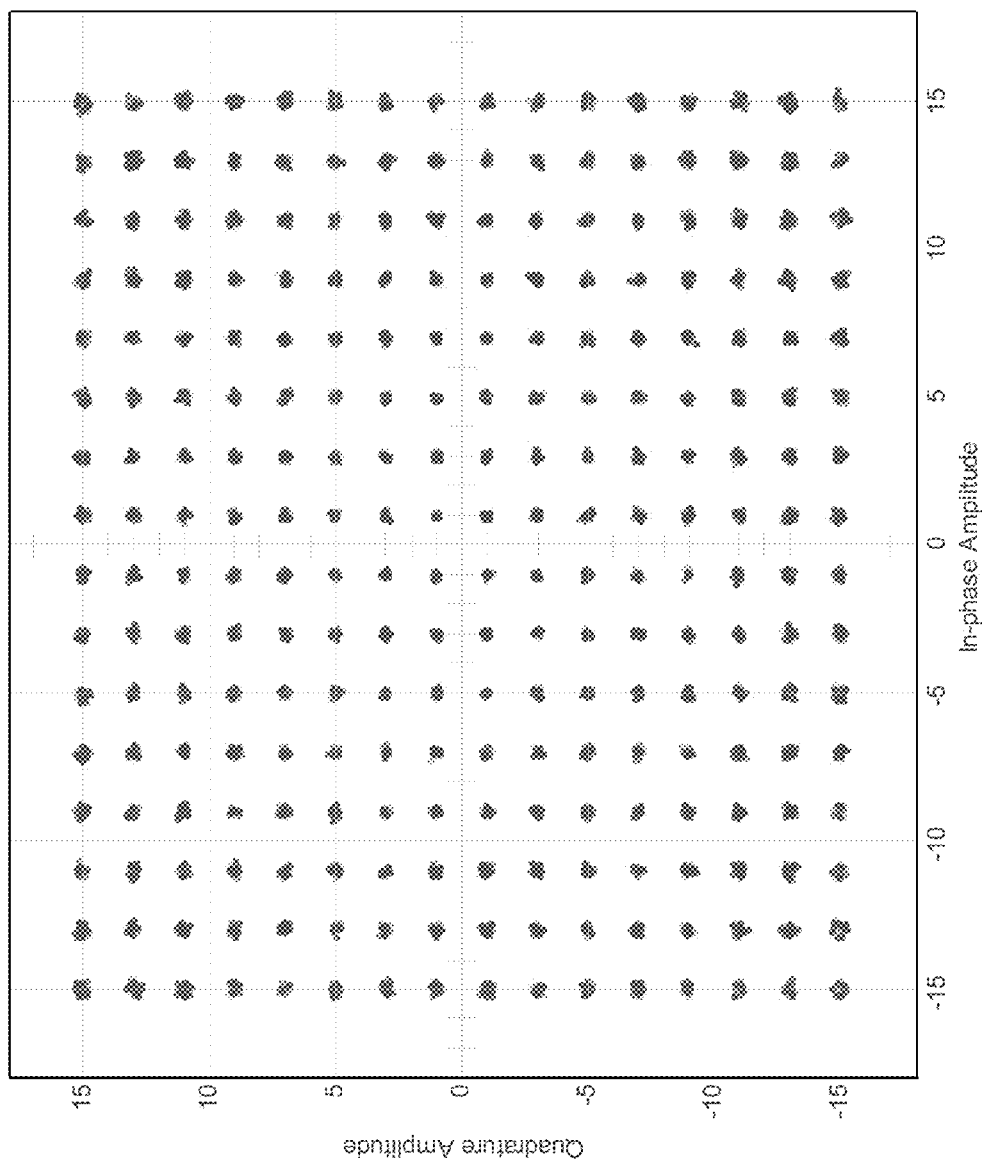
FIG. 6 is an example of a constellation plot resulting from some embodiments.

In contrast, FIG. 6 provides a constellation plot 600 illustrating the demodulation results of the same signal but after the I and Q signals are adaptively adjusted, in accordance with some embodiments, to increase downstream SNR. The constellation plot 600 exhibits a SNR of 39 dB.

Figure 7:
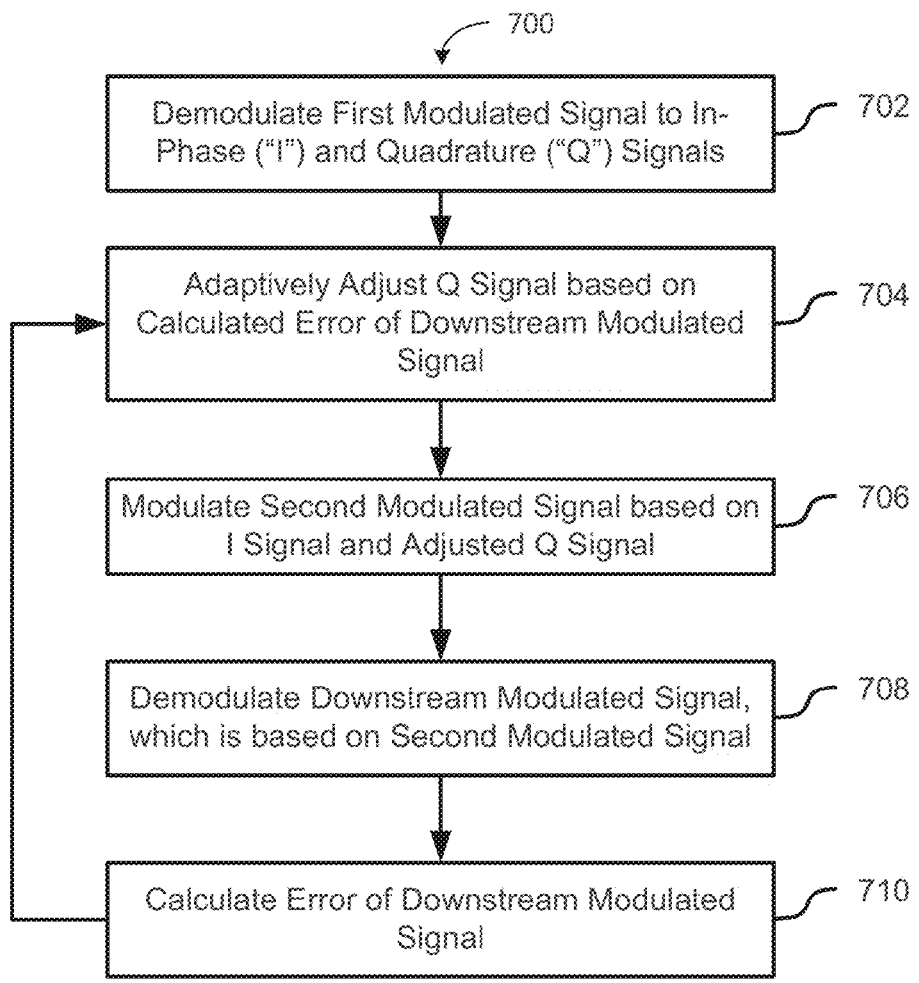
FIG. 7 is a flowchart illustrating an example of a method for signal modulation in accordance with some embodiments.

FIG. 7 is a flowchart 700 illustrating an example of a method for signal modulation in accordance with some embodiments. For certain embodiments, the exemplary method illustrated may be operable with the system 200 of FIG. 2 and/or the split-mount system 400 of FIG. 4. For example, with respect to the split-mount system 400 of FIG. 4, the method may begin at operation 702 with the I/Q demodulator 404 receiving the radio frequency (RF) signal 402 as a first modulate signal and the I/Q demodulator 404 demodulating the RF signal 402 to the in-phase signal (Id) 408a and the quadrature signal (Qd) 410a. As described herein, the RF signal 402 may be received by way of an antenna configured to receive signals at particular radio frequencies (e.g., microwave or millimeter wave frequencies). As illustrated in FIG. 4, each of the in-phase signal (Id) 408a and the quadrature signal (Qd) 410a may be respectively filtered by the low-pass filters 412 and 414, thereby resulting in the filtered in-phase signal (Id') 408b and the filtered quadrature signal (Qd') 410b, respectively.

At operation 704, the filtered quadrature signal (Qd') 410b may be adjusted based on the calculated error provided by a downstream modulated signal from the demodulator 444. For example, during operation 704, the variable gain amplifier (VGA) 416 may be utilized to adjust the differential gain of the filtered quadrature signal (Qd') 410b and/or the multiplier 418 and the cross-tap 420 may utilized to apply a quadrature correction the filtered quadrature signal (Qd') 410b. Such adjustments may be facilitated by the calculated error being transmitted from the IDU 324 to the ODU 320 as telemetry data (e.g., via the telemetry transmitter 454 and the telemetry receiver 432), and the ODU 320 extracting the quadrature correction control signal 438 and/or the differential gain control signal 440 from the received telemetry data (e.g., via the telemetry receiver 432).

Those skilled in the art will appreciate that various embodiments are not limited to the components or the component arrangement shown in the signal path between the I/Q demodulator 404 and the I/Q modulator 422. As such, the filtered in-phase signal (Id') 408b may be adjusted based on the calculated error, and that such adjustment may be in place or in addition to the adjustment of the filtered quadrature signal (Qd') 410b shown in FIG. 4. Additionally, depending on the embodiment, the in-phase signal and/or quadrature signal may be filtered and/or otherwise modified before either is adjusted to increase downstream signal SNR.

At operation 706, the intermediate frequency (IF) signal 426 may be modulated as a second modulated signal, based on the filtered in-phase signal (Id') 408b and the adjusted quadrature signal (Qd'') 410c, by the I/Q modulator 422. As shown in FIG. 4, the in-phase signal (Id) 408a may be filtered by the low-pass filter 412 to the in-phase signal (Id') 408b before being received by the I/Q modulator 422 for modulation.

At operation 708, the demodulator 444 located downstream with respect to the I/Q modulator 422 may receive a downstream modulated signal based on the intermediate frequency (IF) signal 426 (e.g., the second modulated signal) and demodulate the downstream modulated signal to one or more data signals (e.g., I and Q signals for interpretation by a modem coupled to the demodulator 444).

At operation 710, the demodulator 444 in combination with the MSE module 450 may calculate the error 452 to be used in adjusting the filtered quadrature signal (Qd') 410b to adjusted quadrature (Qd'') 410c. Depending on the embodiment, the calculated error 452 may be determined before, during, or after the demodulation of the downstream modulated signal. As noted herein, the MSE module 450 may be configured to apply of an adaptive algorithm, such as steepest decent, to the mean-squared error (MSE) information provided by the demodulator 444 in response to the demodulation of the downstream modulated signal. For some embodiments, subsequent to operation 710, the method may return to operation 704 where the filtered quadrature signal (Qd') 410b may be adjusted based on the calculated error 450 determined at operation 710.

As depicted in FIG. 4, to facilitate the adjustment of the filtered quadrature signal (Qd') 410b, the calculated error 452 may be transmitted to from the IDU 324 to the ODU 320, via the telemetry transmitter 454 and the telemetry receiver 432, in the telemetry data 456 to the ODU. According to some embodiments, the telemetry data 456 may be transmitted from the IDU 324 to the ODU 320 over the cable 322 as information encoded using frequency-shift keying (FSK) modulation. For some embodiments, the telemetry data 456 may be transmitted from the IDU 324 to the ODU 320 at a signal frequency between approximately 4 MHz and 5 MHz.

Those skilled in the art would appreciate that one or more operations of method as illustrated in FIG. 7 could be performed in the context of other systems or components.

As used herein, the term module might describe a given unit of functionality that can be performed in accordance with one or more embodiments. As used herein, a module might be implemented utilizing any form of hardware, software, or a combination thereof. For example, one or more processors, controllers, ASICs, PLAs, PALs, CPLDs, FPGAs, logical components, software routines or other mechanisms might be implemented to make up a module. In implementation, the various modules described herein might be implemented as discrete modules or the functions and features described can be shared in part or in total among one or more modules. Even though various features or elements of functionality may be individually described or claimed as separate modules, one of ordinary skill in the art will understand that these features and functionality can be shared among one or more common software and hardware elements, and such description shall not require or imply that separate hardware or software components are used to implement such features or functionality.

Where components or modules of some embodiments are implemented in whole or in part using software, in some embodiments, these software elements can be implemented to operate with a digital device capable of carrying out the functionality described with respect thereto. An example of a digital device is shown in FIG. 8. After reading this description, it will become apparent to one skilled in the art how to implement various embodiments using other digital devices or architectures.

FIG. 8 is a block diagram of an exemplary digital device 800. The digital device 800 comprises a processor 802, a memory system 804, a storage system 806, a communication network interface 808, an I/O interface 810, and a display interface 812 communicatively coupled to a bus 814. The processor 802 may be configured to execute executable instructions (e.g., programs). In some embodiments, the processor 802 comprises circuitry or any processor capable of processing the executable instructions.

The memory system 804 is any memory configured to store data. Some examples of the memory system 804 are storage devices, such as RAM or ROM. The memory system 804 can comprise the ram cache. In various embodiments, data is stored within the memory system 804. The data within the memory system 804 may be cleared or ultimately transferred to the storage system 806.

The storage system 806 is any storage configured to retrieve and store data. Some examples of the storage system 806 are flash drives, hard drives, optical drives, and/or magnetic tape. In some embodiments, the digital device 800 includes a memory system 804 in the form of RAM and a storage system 806 in the form of flash data. Both the memory system 804 and the storage system 806 comprise computer readable media which may store instructions or programs that are executable by a computer processor including the processor 802.

The communication network interface (com. network interface) 808 can be coupled to a data network (e.g., data network 504 or 514) via the link 816. The communication network interface 808 may support communication over an Ethernet connection, a serial connection, a parallel connection, or an ATA connection, for example. The communication network interface 808 may also support wireless communication (e.g., 802.11 a/b/g/n, WiMax). It will be apparent to those skilled in the art that the communication network interface 808 can support many wired and wireless standards.

The optional input/output (I/O) interface 810 is any device that receives input from the user and output data. The optional display interface 812 is any device that may be configured to output graphics and data to a display. In one example, the display interface 812 is a graphics adapter.

It will be appreciated by those skilled in the art that the hardware elements of the digital device 800 are not limited to those depicted in FIG. 8. A digital device 800 may comprise more or less hardware elements than those depicted. Further, hardware elements may share functionality and still be within various embodiments described herein. In one example, encoding and/or decoding may be performed by the processor 802 and/or a co-processor located on a GPU.

The above-described functions and components can be comprised of instructions that are stored on a storage medium such as a computer readable medium. The instructions can be retrieved and executed by a processor. Some examples of instructions are software, program code, and firmware. Some examples of storage medium are memory devices, tape, disks, integrated circuits, and servers. The instructions are operational when executed by the processor to direct the processor to operate in accord with some embodiments. Those skilled in the art are familiar with instructions, processor(s), and storage medium.

What is claimed is:

1. A signal receiving system configured to convert a first modulated signal to a second modulated signal, the signal receiving system comprising:
   an I/Q demodulator configured to demodulate the first modulated signal to an in-phase ("I") signal and a quadrature ("Q") signal based on a first oscillator signal, the first modulated signal being modulated based on a second oscillator signal that is asynchronous to the first oscillator signal;
   an I/Q signal adjustor configured to adaptively adjust the I or Q signal to increase a signal-to-noise ratio (SNR) of a transitory signal that is based on the second modulated signal, the I or Q signal being adjusted based on a calculated error determined for the transitory signal; and
   an I/Q modulator configured to modulate the second modulated signal based on the I signal and the Q signal as adjusted.

2. The signal receiving system of claim 1, wherein adaptively adjusting the I or Q signal comprises adjusting a gain of the I or Q signal based on the calculated error.

3. The signal receiving system of claim 1, wherein adaptively adjusting the I or Q signal comprises applying a correction to the I or Q signal.

4. The signal receiving system of claim 3, wherein the I/Q signal adjustor comprises a multiplier configured to apply the correction to the I or Q signal.

5. The signal receiving system of claim 1, wherein the first modulated signal is based on a radio frequency signal.

6. The signal receiving system of claim 1, wherein the signal receiving system is an out-door unit (ODU).

7. The signal receiving system of claim 6, wherein the ODU is configured to receive the calculated error from an in-door unit (IDU) as telemetry data.

8. A method for downconverting a first modulated signal to a second modulated signal, the method comprising:
   demodulating the first modulated signal to an in-phase ("I") signal and a quadrature ("Q") signal based on a first oscillator signal, the first modulated signal being modulated based on a second oscillator signal that is asynchronous to the first oscillator signal;
   adaptively adjusting the Q signal to increase a signal-to-noise ratio (SNR) for a transitory signal that is based on the second modulated signal, the Q signal being adjusted based on a calculated error for the transitory signal; and
   modulating the second modulated signal based on the I signal and the Q signal as adjusted.

9. The method of claim 8, wherein adaptively adjusting the I or Q signal comprises adjusting a gain of the I or Q signal based on the calculated error.

10. The method of claim 8, wherein adaptively adjusting the I or Q signal comprises applying a correction to the I or Q signal based on the calculated error.

11. The method of claim 8, wherein the correction is applied by a multiplier that applies the correction to the I or Q signal.

12. The method of claim 8, further comprising receiving the calculated error from an in-door unit (IDU).

13. The method of claim 12, wherein the calculated error is received from the IDU as telemetry data.

14. A signal receiving system configured to convert a first modulated signal to a second modulated signal, the signal receiving system comprising:
- means for demodulating the first modulated signal to an in-phase ("I") signal and a quadrature ("Q") signal based on a first oscillator signal, the first modulated signal being modulated based on a second oscillator signal that is asynchronous to the first oscillator signal;
- means for adaptively adjusting the Q signal to increase a signal-to-noise ratio (SNR) for a transitory signal that is based on the second modulated signal, the Q signal being adjusted based on a calculated error for the transitory signal; and
- means for modulating the second modulated signal based on the I signal and the Q signal as adjusted.

* * * * *